United States Patent [19]
Wiles
[11] 3,838,414
[45] Sept. 24, 1974

[54] DIGITAL WAVE SYNTHESIZER

[75] Inventor: Michael F. Wiles, Phoenix, Ariz.
[73] Assignee: Motorola, Inc., Franklin Park, Ill.

[22] Filed: Aug. 3, 1972
[21] Appl. No.: 277,713

[52] U.S. Cl. ...... 340/347 DA, 340/347 DD, 328/14
[51] Int. Cl. ........................................... H03k 13/04
[58] Field of Search 340/347 DA, 347 SY, 347 DD; 235/197; 328/14, 187

[56] References Cited

UNITED STATES PATENTS

| | | | |
|---|---|---|---|
| 3,217,147 | 11/1965 | Caapman, Jr. | 340/347 DA X |
| 3,506,815 | 4/1970 | Stone | 340/347 DD X |
| 3,576,561 | 4/1971 | Dureau | 340/347 DA |
| 3,576,562 | 4/1971 | Sakic | 340/347 DD |
| 3,641,566 | 2/1972 | Konrad et al. | 340/347 DA |
| 3,689,914 | 9/1972 | Butler | 340/347 DA |

*Primary Examiner*—Charles D. Miller
*Attorney, Agent, or Firm*—Vincent J. Rauner; Kenneth R. Stevens

[57] ABSTRACT

A digital wave synthesizer provides an output waveform of frequency $f$ in response to an input of periodic pulses from a clock source at a frequency of $2^n f$. The periodic pulses are received by a simple binary counter of n stages which provides n outputs, each from one stage, in a time sequence in accordance with the count of the counter. A code converter receives each of the n outputs from the counter and also the periodic pulses, combines them and provides $2^n$ unique output signals. An output circuit comprised of a resistive ladder network receives the $2^n$ output signals and provides $2^n$ voltage signals at predetermined levels which, in sequential occurrence, produce the symmetrical waveform output.

3 Claims, 4 Drawing Figures

DIGITAL WAVE SYNTHESIZER

BACKGROUND OF THE INVENTION

1. Field of the Invention

This invention relates to an arrangement for providing a symmetrical waveform output in response to a series of pulses, and in particular to producing a sine wave of frequency $f$ in response to a periodic pulse input at a frequency of $2^n f$, where n is the number of stages in a simple binary counter which receives the periodic pulses.

In the prior art, it has been common practice to utilize a high frequency pulse train as digital data for a variety of reasons. Digital computers, for example, operate at extremely high speeds utilizing digital data in the form of bi-level pulses. Transmission of the pulses is often better effected by changing from digital to analog. Conversely, an analog signal can be converted into digital pulses for data handling.

In the past, producing a symmetrical analog waveform in response to a series of periodic pulses has been expensive in terms of necessary hardward and time. For example, counters capable of being shifted left and right and of counting up and down have been used in the prior art to provide outputs in response to an input of periodic pulses. The conversion of these sophisticated counter outputs has been a further complication, often with feedback circuits to control the counter.

The present invention uses a simple ripple binary counter, a simple converter and an output circuit comprised of a resistive ladder having values of resistance that are readily ascertainable.

BRIEF SUMMARY OF THE INVENTION

A series of periodic pulses of a frequency $2^n f$ is provided to a simple binary counter having n stages. A positive voltage may arbitrarily be designated a binary "1" and a more negative or zero voltage may arbitrarily be designated as a binary "0." Assuming that the n stages of the binary counter are all in the 1 state, the first 1 of the periodic pulses switches the least significant stage to a 0, the second 1 from the periodic pulses switching the least significant stage back to a 1 and the next least significant stage to a 0, and so on in typical binary counting fashion.

An output from each of the *n* stages of the counter serves as one of n inputs to a code converter, which also has as an input, the periodic pulses. These inputs are all combined in the converter to produce $2^n$ unique output signals, each on its own output line. Each output line is connected to one end of a respective one of $2^n$ resistors whose other ends are tied together to a voltage source. The resistors are of a predetermined value so that when a circuit is completed between the voltage source and one of the n output lines, a unique voltage is produced at a sequential time. By providing sequential activation of each of the *n* output lines, sequential voltages are provided at the common end of the n resistors to produce a symmetrical waveform of frequency $f$.

When the input frequency of $2^n f$ increases, the output frequency f also increases. The system therefore is capable of frequency modulation.

An object of this invention is to provide a symmetrical, analog waveform in response to a digital input.

A more specific object is to provide an analog waveform output of frequency $f$ in response to an input of periodic pulses of frequency $2^n f$ where n is an integer.

Another object is to provide a sine wave output whose frequency changes in response to a change in the frequency of an input of periodic pulses.

These and other objects will be made more evident in the detailed description that follows.

DETAILED DESCRIPTION OF THE INVENTION

Figure 1:
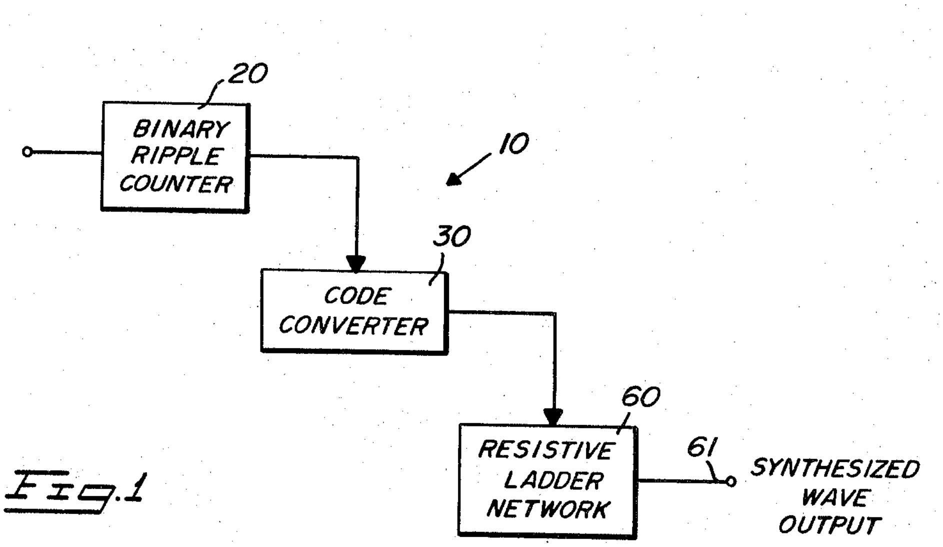
FIG. 1 is a block diagram illustrating the main elements of the synthesizer.

FIG. 1 illustrates a simple binary counter 20 having an input from a clock (or pulse generator) which provides periodic pulses. A code converter 30 of the digital wave synthesizer 10 receives an output from the binary counter 20 and produces an output to resistive ladder network 60. The network 60 provides the synthesized symmetrical waveform output on output line 61.

Figure 2:
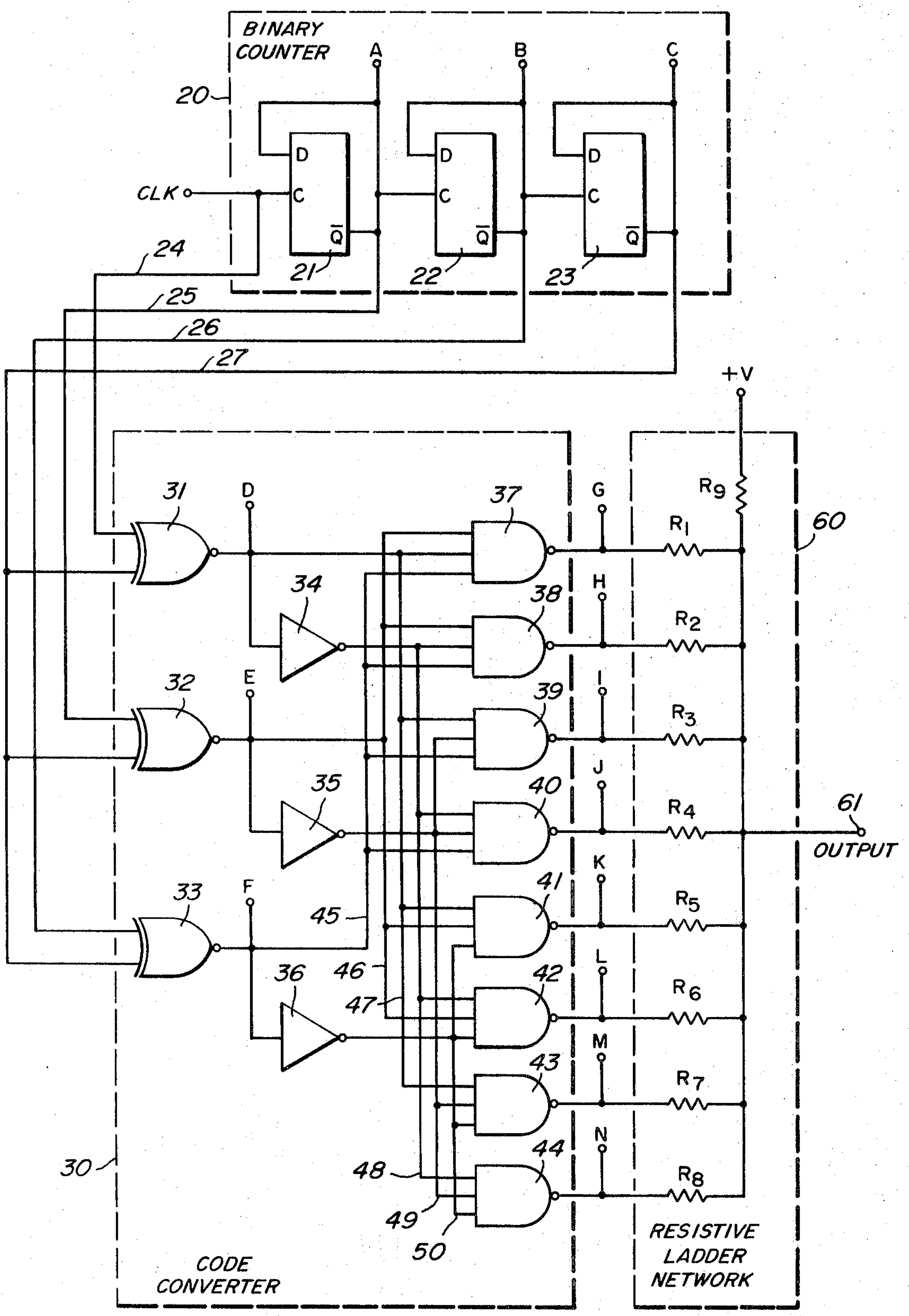
FIG. 2 is a logic diagram showing each of the main elements in at least logic schematic detail.

Referring now to FIG. 2, it can be seen that the preferred embodiment illustrated herein utilizes a three-stage binary counter 20. It will become evident in the description that follows, that a smoother synthesized output waveform will result if a larger binary counter is utilized. This of course is a matter of design choice.

Flip-flops 21, 22 and 23 are of conventional design that change state if conditioned to do so when the "C" input of each receives a negative going signal. The $\overline{Q}$ output of flip-flop 21 is tied to the "C" input of flip-flop 22 and to the "D" conditioning input of flip-flop 21. The "C" input of flip-flop 21 receives the periodic pulses from the clock "CLK." The $\overline{Q}$ output of flip-flop 22 serves as the "C" input to flip-flop 23 and as the "D" input to flip-flop 22. The $\overline{Q}$ output of flip-flop 23 serves as the "D" input to flip-flop 23.

The code converter 30 has exclusive NOR circuits 31, 32 and 33, and inverters 34, 35 and 36 as a decoder stage. One input to exclusive NOR circuit 31 is on line 24 from the clock "CLK" and its other input is on line 27 from the $\overline{Q}$ output of flip-flop 23. Exclusive NOR circuit 32 has an input on line 25 from the $\overline{Q}$ output of flip-flop 21 and has an input on line 27 from the $\overline{Q}$ output of flip-flop 23. Exclusive NOR circuit 33 has an input on line 26 from the $\overline{Q}$ output of flip-flop 22 and has another input on line 27 from the $\overline{Q}$ output of flip-flop 23. Inverter 34 is connected to the output of exclusive NOR circuit 31, inverter 35 is connected to the output of exclusive NOR circuit 32 and inverter 36 is connected to the output of exclusive NOR circuit 33.

The code converter has a combining stage which is comprised of NAND circuits 37 through 44. Each of these NAND circuits has three inputs and a single output. NAND circuit 37 has an input on line 45 from exclusive NOR circuit 33 which also provides an input to NAND circuits 38, 39 and 40. A second input to NAND circuit 37 is on line 46 from exclusive NOR circuit 32 which also serves as an input to NAND circuits 38, 41 and 42. The third input to NAND circuit 37 is on line 47 which is an output of exclusive NOR circuit 31 which serves as an input to NAND circuits 39, 41 and 43. The third input to NAND circuit 38 is on line 48 which is an output of inverter 34, also serving as an input to NAND circuits 40, 42 and 44. The third input to NAND circuit 39 is on line 49 from the output of inverter 35 which also serves as an input to NAND circuits 40, 43 and 44. The third input to NAND circuit 41 is on line 50 from the output of inverter 36 which serves an an input to NAND circuits 42, 43 and 44.

The output circuit 60 is comprised of resistors $R_1$–$R_8$ connected together at one end to one end of resistor $R_9$, the other end of which is connected to a source of positive voltage "+V." The other end of resistor $R_1$ is connected to the output of NAND circuit 37; in like manner $R_2$ is connected to NAND circuit 38; resistor $R_3$ is connected to NAND circuit 39; resistor $R_4$ is connected to NAND circuit 40; resistor $R_5$ is connected to NAND circuit 41; resistor $R_6$ is connected to NAND circuit 42; resistor $R_7$ is connected to NAND circuit 43; resistor $R_8$ is connected to NAND circuit 44. Line 61 is connected to the common connection of resistors $R_1$ through $R_8$ and serves as the output of the synthesizer.

Figure 4:
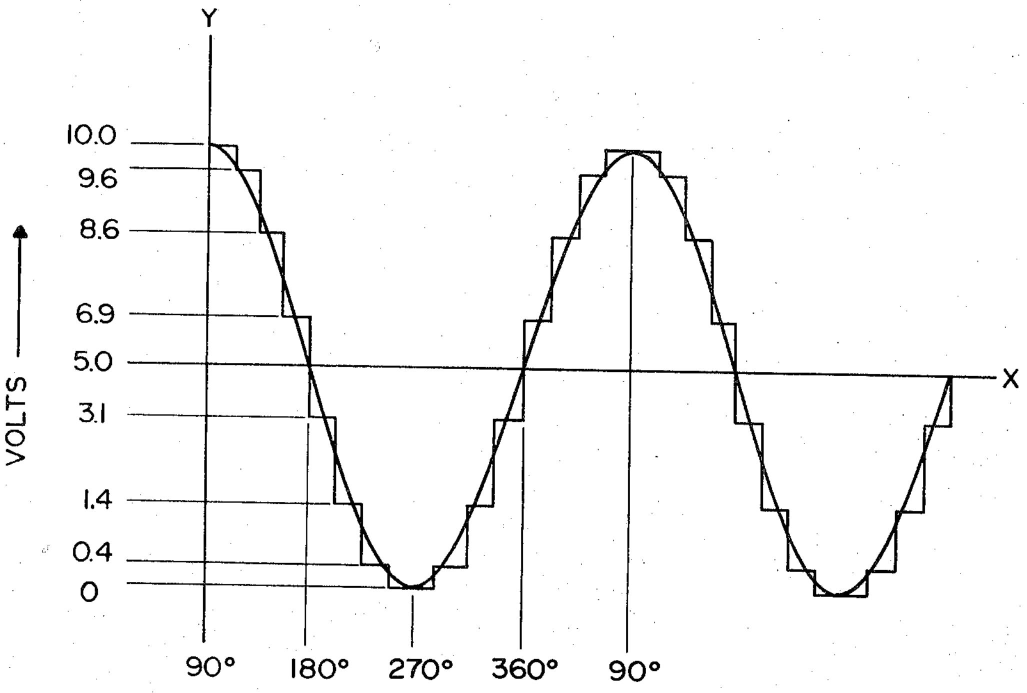
FIG. 4 illustrates the synthesized output waveform.
Figure 3:
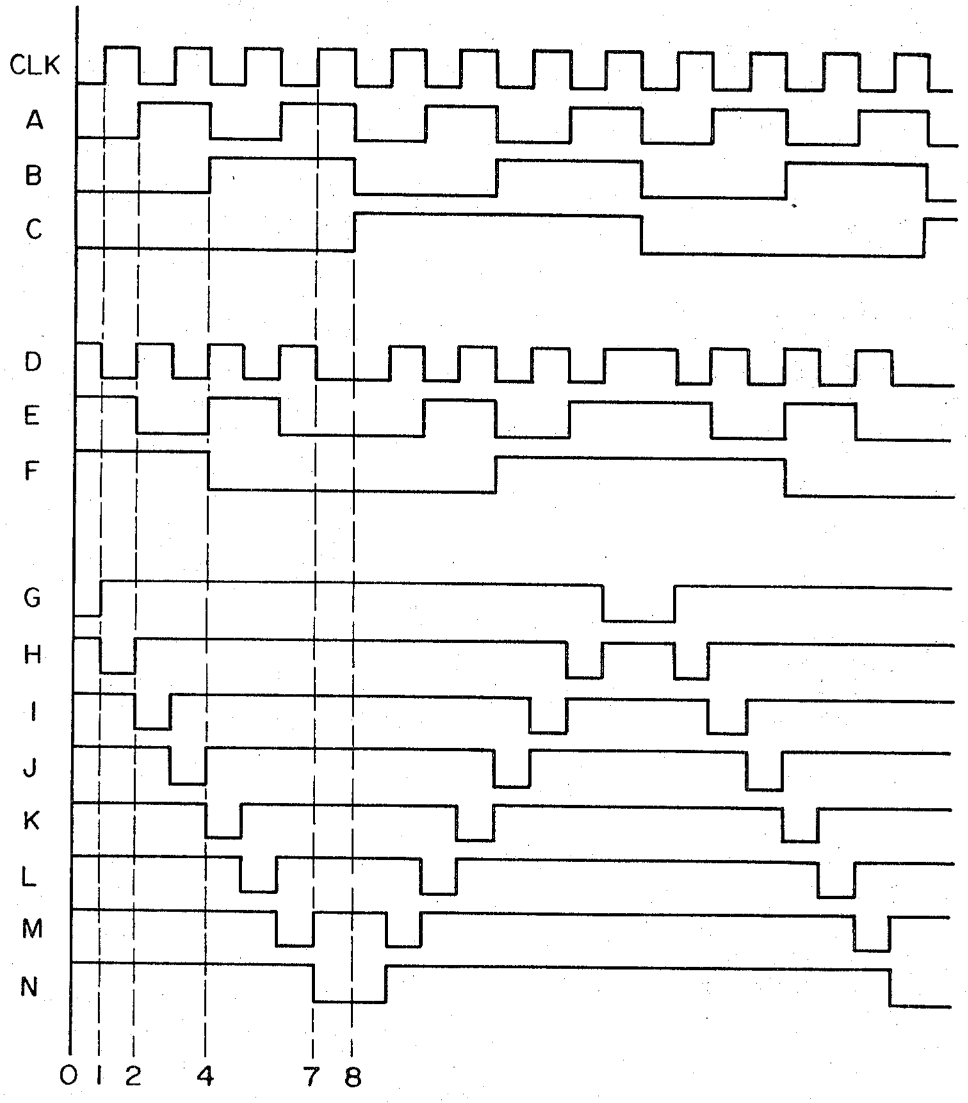
FIG. 3 is a timing diagram illustrating idealized signals occurring at specified points in FIG. 2.

FIGS. 3 and 4 will be explained in the following discussion of the operation of the synthesizer.

MODE OF OPERATION

Reference should be made to FIGS. 2 and 3 for a clear understanding of the operation of this invention. Assume at the outset that flip-flops 21, 22 and 23 are in the 1 state so that the $\overline{Q}$ output of each of them is in the 0 state. This condition is evidenced by signals A, B and C of FIG. 3 starting at zero. The periodic pulses which are applied to the "C" input of flip-flop 21 are shown as "CLK" in FIG. 3.

With the $\overline{Q}$ output of flip-flop 21 equal to 0 and applied to the "D" conditioning input of flip-flop 21, it can be seen at time 2 that the negative going edge of the "CLK" pulse clears flip-flop 21 to the 0 state thus causing the $\overline{Q}$ output to go to 1 as evidenced by signal A. Since the $\overline{Q}$ output of flip-flop 21 serves as the "C" input to flip-flop 22, flip-flop 22 will not be cleared to 0 at time 2 because its "C" input goes positive at that time. At time 4 however, the negative going "CLK" pulse sets flip-flop 21 to a 1 because its "D" conditioning input was a 1 at that time, and the negative edge of "CLK" toggles the flip-flop. The $\overline{Q}$ output of flip-flop 21 therefore goes negative, and on that negative edge flip-flop 22 is cleared to a 0 because its $\overline{Q}$ output was a 0 and conditioned its "D" input. Flip-flop 23 is unaffected for the same reason that flip-flop 22 was unaffected at time 2.

At time 8, the "CLK" pulse sets flip-flop 22 to a 1 causing its $\overline{Q}$ output to go to 0 which in turn causes flip-flop 23 to become cleared to a 0 state as evidenced by its $\overline{Q}$ output going to 1 as shown in signal C of FIG. 3. The counter 20 continues to count in typical fashion. That is to say, it counts until flip-flops 21, 22 and 23 are all set and then clears them as described above. There is no additional control needed. The counter could, of course, contain more stages and operate in exactly the fashion as described above. Also, the initial state could be all zero, and then switching to the 1 state in the reverse of the operation above.

The "CLK" output and the "A," "B" and "C" outputs are connected to exclusive NOR circuits 31, 32 and 33 which have output signals shown on FIG. 3 as "D," "E" and "F," respectively. The circuit is wired in such a way that the outputs of the exclusive NOR circuits 31, 32 and 33 respectively, are represented by the following Boolean equations:

$$D = C\cdot CLK + \overline{C}\cdot\overline{CLK} \qquad (1)$$

$$E = A\cdot C + \overline{A}\cdot\overline{C} \qquad (2)$$

$$F = B\cdot C + \overline{B}\cdot\overline{C} \qquad (3)$$

This logic relationship is evident upon examination of FIG. 3 with particular reference to signals D, E and F.

Inverters 34, 35 and 36 are connected respectively to the outputs of exclusive NOR circuits 31, 32 and 33 so that they receive, respectively, signals "D," "E" and "F." The inverters therefore produce on their outputs, respectively "D," "E" and "F."

The final combining section of the code converter 30 is comprised of NAND circuits 37 through 44. Each of these NAND circuits has three inputs and a single output represented by signals "G" through "N" shown in FIG. 3. The circuit is wired such that the following Boolean expressions result:

$$G = \overline{D} + \overline{E} + \overline{F} \qquad (4)$$

$$H = D + \overline{E} + \overline{F} \qquad (5)$$

$$I = \overline{D} + E + \overline{F} \qquad (6)$$

$$J = D + E + \overline{F} \qquad (7)$$

$$K = \overline{D} + \overline{E} + F \qquad (8)$$

$$L = D + \overline{E} + F \qquad (9)$$

$$M = \overline{D} + E + F \qquad (10)$$

$$N = D + E + F \qquad (11)$$

As will be described, the significant point in the outputs as evidenced by signals G through N, is when these signals go to 0. Therefore, the following table showing the circumstances demanded for the outputs to equal zero will be helpful when referring to FIG. 3.

| D | E | F | | |
|---|---|---|---|---|
| 1 | 1 | 1 | 0 | G |
| 0 | 1 | 1 | 0 | H |
| 1 | 0 | 1 | 0 | I |
| 0 | 0 | 1 | 0 | J |
| 1 | 1 | 0 | 0 | K |
| 0 | 1 | 0 | 0 | L |
| 1 | 0 | 0 | 0 | M |
| 0 | 0 | 0 | 0 | N |

When the outputs of NAND circuits 37 through 44 go to zero as shown in signals G through N of FIG. 3, current will flow from +V through resistor $R_9$ and through one of resistors $R_1$ through $R_8$, depending upon which of NAND circuits 37 through 44 has an output in the 0 state. The values of resistance for resistors $R_1$ through $R_8$ are predetermined so as to provide a particular level of voltage between $R_9$ and the selected resistor from $R_1$ through $R_8$. In the embodiment herein illustrated, a sine wave is generated using a total of nine different voltages, including +V. The resistance values are selected by the equation:

$$V_n = R_n/(R_n + R_9) \cdot +V \quad (12)$$

Where $R_n$ represents any of the desired values of $R_1$ through $R_8$.

Where $V_n$ represents the desired voltage level.

These values depend upon the sine of the particular angle and the limits chosen as maximum and minimum. In the embodiment shown herein, since nine voltage points are selected, there are eight divisions between 90° and 270° as shown in FIG. 4. The angular difference therefore between successive voltage points is 180° divided by eight, which is 22.50°. If a counter with more stages were used, the angular displacement between points would, of course, be less.

For purposes of illustration, assume that:

$+V = 10$ volts $R_8 = 0$ ohms $R_9 = 10K$ ohms

These arbitrarily selected parameters establish a range of zero volts with $R_8$ equal to zero ohms, to 10 volts when none of resistors $R_1$–$R_8$ conduct current. Using this 10 volt scale, the following illustrative computations can be made.

$$\text{Sin } 112.5° = 0.92$$

To convert to the scale of 0–10 volts, there must be a multiplication by five and a shift of five units:

$$V_1 = 0.92 \times 5 + 5 = 9.6 \text{ volts}$$

Using equation 12 above and solving for $R_8$ ($R_n$):

$$R_1 = (V_1 \cdot R_9)/(+V - V_1)$$

$$R_1 = (9.6 \cdot 10K)/(10 - 9.6) = 240K$$

In similar fashion, Sin 135° = 0.71

$V_2 = 0.71 \times 5 + 5 = 8.6$ volts $R_2 = 61K$ ohms

In exactly the same fashion as above, the remaining values of $V_n$ and corresponding $R_n$ values are computed. The values of $V_n$ are shown in FIG. 4 in the "Y" axis, with the "X" axis denoting the angular displacement. The values of $R_n$ are as follows:

| | |
|---|---|
| $R_1$ = 240K ohms | $R_5$ = 4.5K ohms |
| $R_2$ = 61K ohms | $R_6$ = 1.6K ohms |
| $R_3$ = 22K ohms | $R_7$ = 420 ohms |
| $R_4$ = 10K ohms | $R_8$ = 0 |

FIG. 4 makes it clear that if more discrete voltage levels were made available by way of using more logic and a longer counter, that the resultant symmetrical waveform would be smoother. Also, it is obvious to one with skill in the art that the appropriate use of other logic circuits such as "AND" and "OR" and double inverters could be used to perform the function of the "NAND" and "NOR" circuits without varying from the scope and intent of this invention.

I claim:

1. A digital wave synthesizer adapted to receive periodic pulses from a pulse generated source, such pulses occurring at a frequency of $2^n f$ for providing a symmetrical waveform output at a frequency f, comprising:

a. a unidirectional binary counter of n stages, having an input to receive the periodic pulses for providing output signals on $n$ output lines;

b. a code converter for receiving n output signals from the counter and the periodic pulses for providing $2^n$ output signals in a predetermined sequential manner;

c. output means for receiving the $2^n$ output signals from the code converter and for responding to each of the $2^n$ output signals to form the symmetrical waveform output;

d. said output means further comprising a resistive ladder network having $2^n$ resistances connected together at one end to a voltage reference source and separated at the other end to receive each of the $2^n$ output signals of the code converter for providing $2^n$ voltage signals at levels predetermined by the values of each of the $2^n$ resistances, which in sequential occurrence produce the symmetrical waveform output;

e. said code converter including decoder means for receiving and combining the n output signals of the counter and the periodic pulses for providing n output signals and the reciprocals thereof;

f. combining means adapted to receive and combine the n output signals and reciprocals thereof from the decoder for producing the $2^n$ output signals; and g. the decoder means further comprising $n$ Exclusive-NOR circuits and n inverter circuits, the n Exclusive-NOR circuits being adapted to receive and combine the n outputs from the counter and the periodic pulses, and each providing an output to the combining means and to a respective one of the inverter circuits, each of the $n$ inverter circuits for providing an output to the combining means.

2. A digital wave synthesizer adapted to receive periodic pulses from a pulse generated source, such pulses occurring at a frequency of $2^n f$ for providing a symmetrical waveform output at a frequency $f$ as in claim 1 wherein:

a. said combining means further comprise $2^n$ NAND circuits each adapted to receive a total of $n$ outputs from the Exclusive-NOR circuits and from the $n$ inverter circuits in a combination unique to each of the NAND circuits for producing the $2^n$ output signals.

3. A digital wave synthesizer adapted to receive periodic pulses from a pulse generated source, such pulses occurring at a frequecy of $2^n f$ for providing a symmetrical waveform output at a frequency f comprising:

a. a unidirectional ripple binary counter of $n$ stages, having an input to receive the periodic pulses and having an n output line from respective ones of said n stages for providing n output signals;

b. a code converter having $2^n$ output lines for receiving the $n$ output signals from the unidirectional binary ripple counter and the periodic pulses and combining them to form n signals and their reciprocals and for combining said $n$ signals and their reciprocals for providing $2^n$ output signals in a one out of $2^n$ format whereby each said outline is energized sequentially in an order begining with line 1 going to line $2^n$ and then going from line $2^n$ to line 1;

c. output means for receiving the $2^n$ output signals from the code converter and for responding to each of the $2^n$ output signals to form the symmetrical waveform output; and d. said output means further comprising a resistive ladder network having $2^n$ resistances connected together at one end to a voltage source and at their other ends separately to receive respectively the $2^n$ output signals of the code converter for providing $2^n$ voltage signals at levels predetermined by the values of each of the $2^n$ resistances, which in sequential occurrence produce the symmetrical waveform output.

* * * * *